United States Patent
Hwang et al.

(10) Patent No.: US 12,237,181 B2
(45) Date of Patent: Feb. 25, 2025

(54) SUPPORT UNIT AND SUBSTRATE TREATING APPARATUS

(71) Applicant: SEMES CO., LTD., Cheonan-si (KR)

(72) Inventors: Ho Jong Hwang, Hwaseong-si (KR); Do Yeon Kim, Yongin-si (KR); Hyun Yoon, Hwaseong-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 337 days.

(21) Appl. No.: 17/703,255

(22) Filed: Mar. 24, 2022

(65) Prior Publication Data

US 2023/0307260 A1    Sep. 28, 2023

(51) Int. Cl.
| | | |
|---|---|---|
| *H01L 21/67* | (2006.01) | |
| *B08B 3/02* | (2006.01) | |
| *B08B 3/04* | (2006.01) | |
| *B08B 3/08* | (2006.01) | |
| *H01L 21/687* | (2006.01) | |

(52) U.S. Cl.
CPC ........ *H01L 21/67051* (2013.01); *B08B 3/022* (2013.01); *B08B 3/041* (2013.01); *B08B 3/08* (2013.01); *H01L 21/68764* (2013.01)

(58) Field of Classification Search
None
See application file for complete search history.

(56) References Cited

U.S. PATENT DOCUMENTS

2004/0231711 A1   11/2004   Park et al.

FOREIGN PATENT DOCUMENTS

| JP | H10-199964 A | 7/1998 |
|---|---|---|
| JP | 2008-159789 A | 7/2008 |
| JP | 2018-170436 A | 11/2018 |
| KR | 10-2005-0070705 A | 7/2005 |
| KR | 10-2011-0096852 A | 8/2011 |
| KR | 10-2012-0008854 A | 2/2012 |
| KR | 10-2013-0028181 A | 3/2013 |
| KR | 10-2017-0014327 A | 2/2017 |
| KR | 102097009 B1 | 5/2020 |
| KR | 102176464 B1 | 11/2020 |

OTHER PUBLICATIONS

KR 20120008854 A translation, Apparatus for Treating a Substrate, Noh (Year: 2012).*
Korean Notice of Allowance dated Feb. 27, 2023 issued in corresponding Korean Appln. No. 10-2020-0138455.
Japanese Office Action dated Mar. 20, 2023 issued in corresponding Japanese Appln. No. 2022-046596.

\* cited by examiner

*Primary Examiner* — Cristi J Tate-Sims
(74) *Attorney, Agent, or Firm* — Harness, Dickey & Pierce, P.L.C.

(57) ABSTRACT

The present invention provides a substrate treating apparatus. The substrate treating apparatus includes: a cup having a treatment space therein; a support unit configured to support a substrate within the treatment space, and including a rotatable support plate; and a liquid discharge unit configured to discharge a chemical liquid to the substrate supported by the support unit, in which the support unit includes: a plurality of pin members provided to the support plate to support the substrate placed on the support plate; and a discharge member coupled to the pin member to discharge charges to the air according to a rotation of the support plate, and the discharge member is provided as a conductive member.

20 Claims, 8 Drawing Sheets

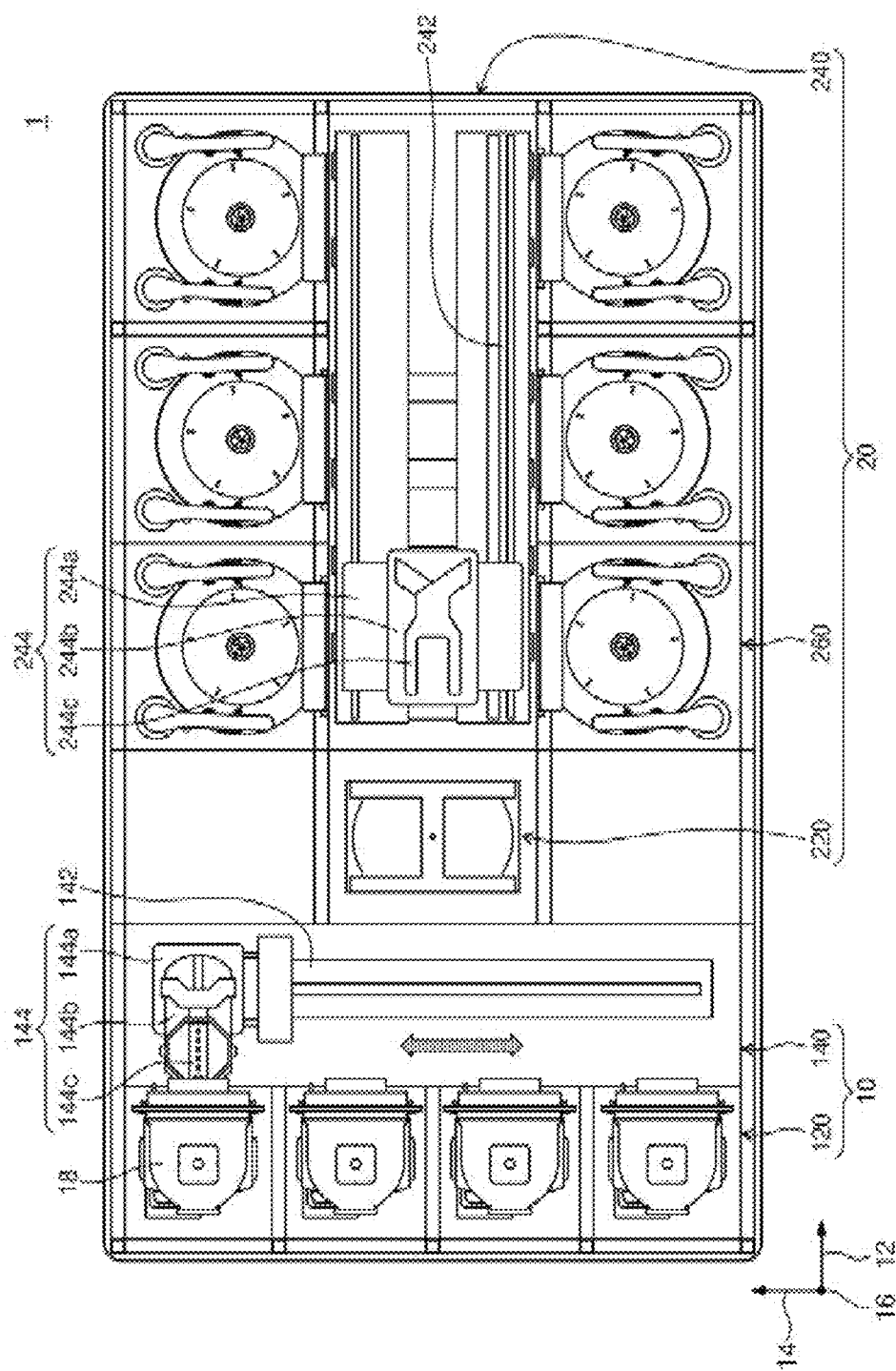
[FIG. 1]

[FIG. 2]
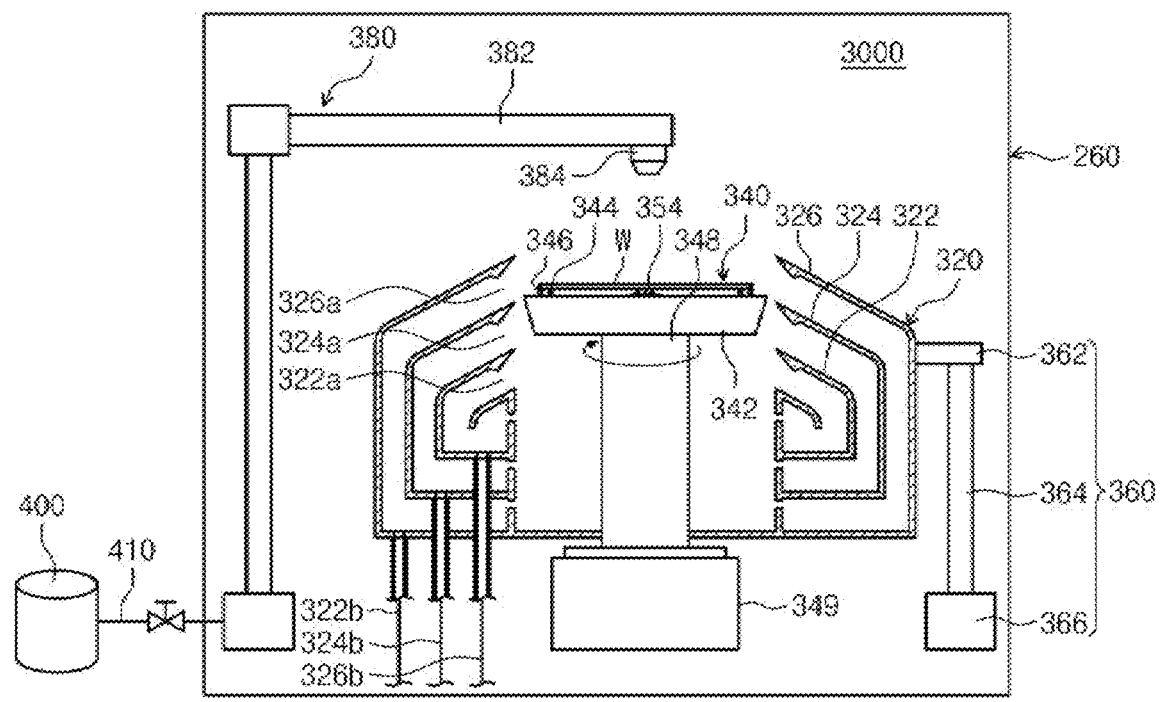

[FIG. 3]
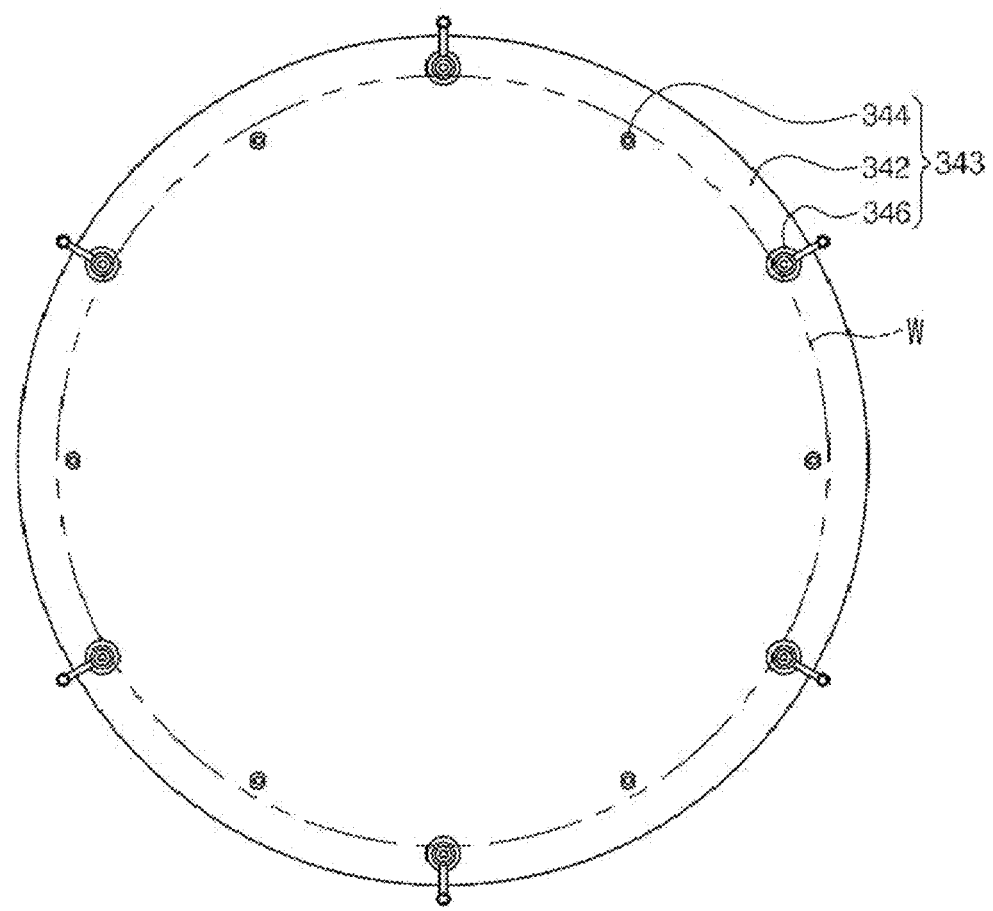

[FIG. 4]
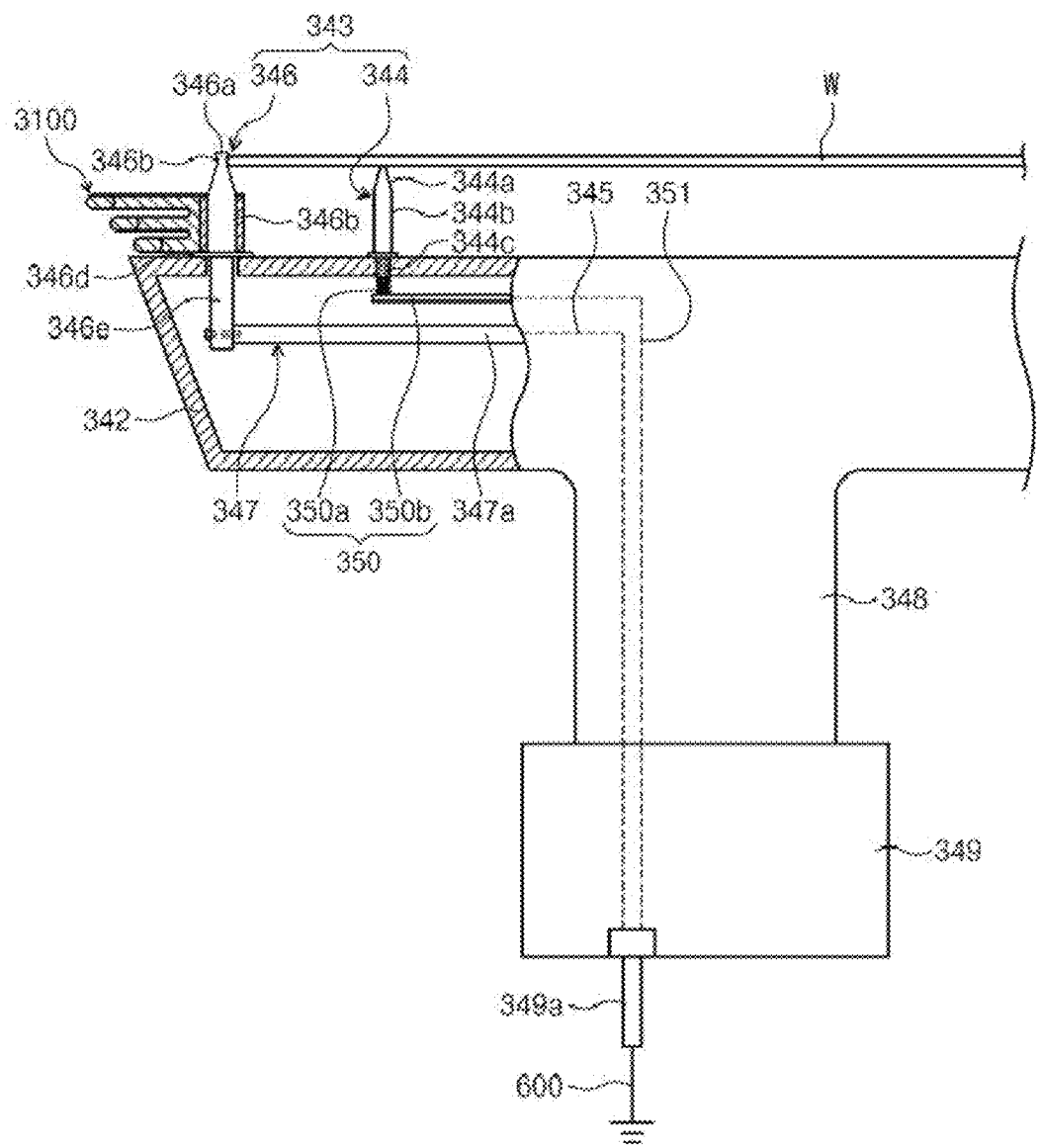

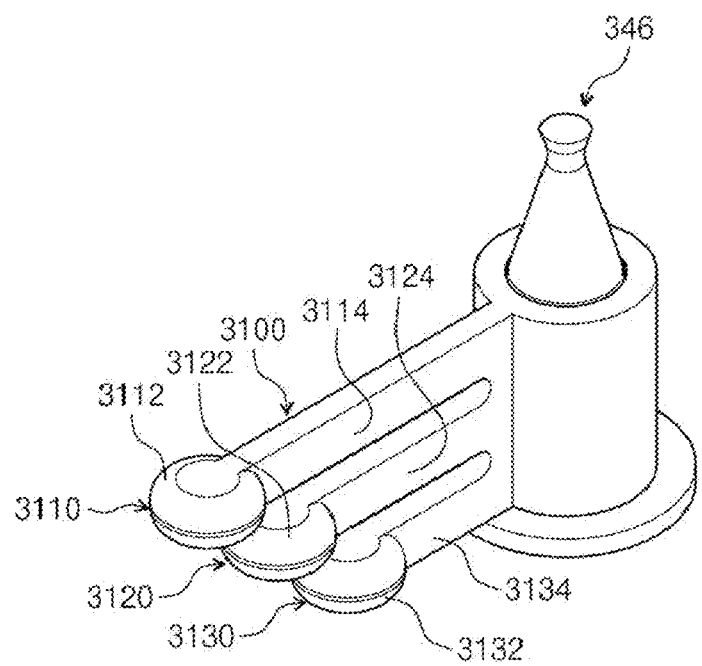
[FIG. 5]

[FIG. 6]
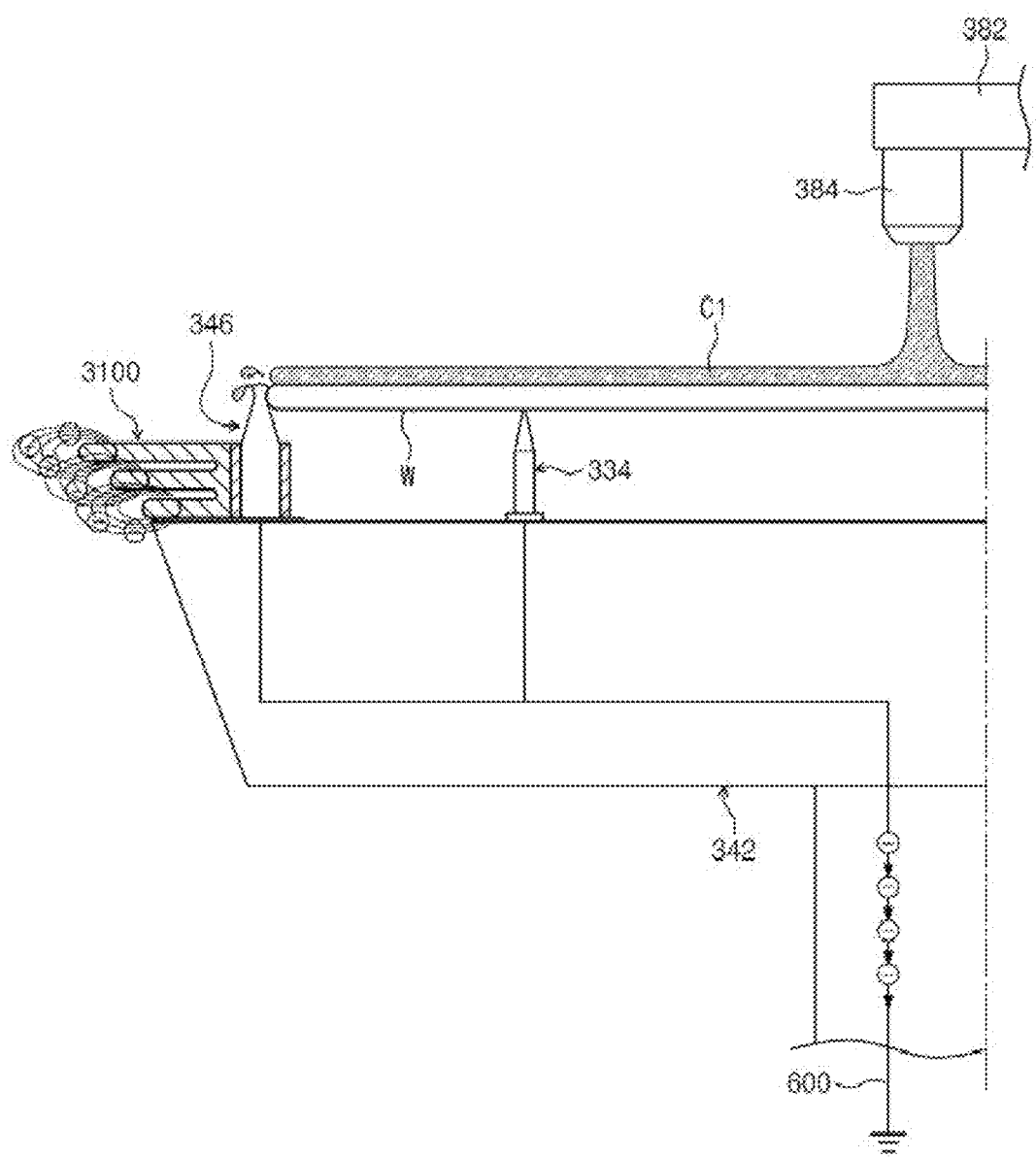

[FIG. 7]
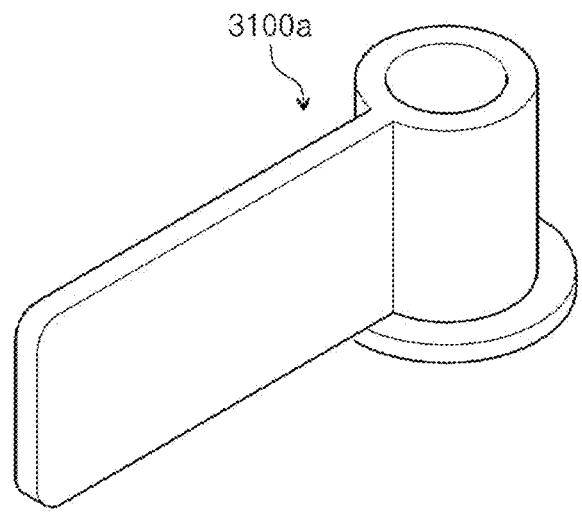
[FIG. 8]
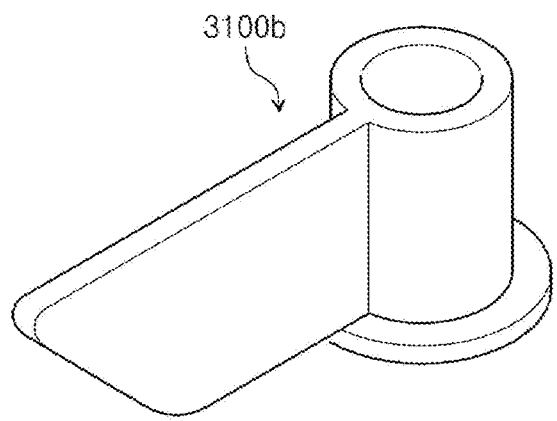

[FIG. 9]
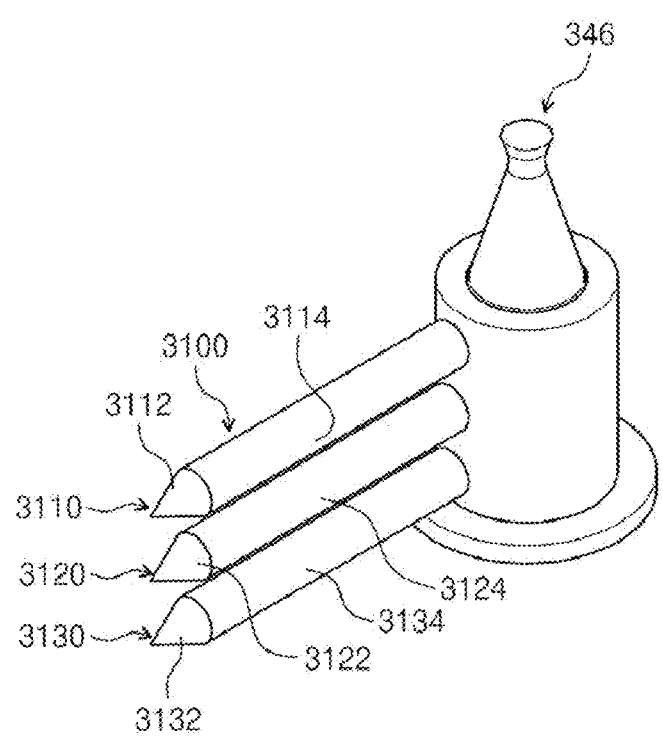

SUPPORT UNIT AND SUBSTRATE TREATING APPARATUS

TECHNICAL FIELD

The present invention relates to a support unit supporting a substrate, such as a wafer, and a substrate treating apparatus including the same.

BACKGROUND ART

In general, a semiconductor device is manufactured by depositing various materials in the form of thin films on a substrate and patterning the thin film. To this end, various stages of difference processes, such as deposition process, photo process, etching process, and cleaning process, are required.

Among the processes, the etching process is a process of removing a film formed on the substrate, and the cleaning process is a process of removing contaminants remaining on the substrate surface after each unit process for semiconductor manufacturing is performed. The etching process and the cleaning process are classified into a wet method and a dry method according to the process progress method, and the wet method is classified into a batch type method and a spin type method.

In the spin type method, after fixing a substrate to a support unit capable of processing a single substrate, a chemical liquid for example, an etchant, a cleaning solution, or a rinse solution) is supplied to the substrate through a liquid supply nozzle while the substrate is rotated, and the substrate is cleaned by spreading the chemical liquid over the entire surface of the substrate by centrifugal force, and after the process of cleaning the substrate, the substrate is dried in various ways.

In a spin-type processing apparatus, substrate cleaning is performed while the substrate is rotated, and static electricity is generated due to the chemical liquid supplied to the substrate during the rotation or other reasons. Such static electricity adversely affects (for example, arcing damage or reattachment of particles) the driving of the equipment and the substrate. In order to solve the problem, by connecting a chucking pin and a rotating shaft with a conductive line to discharge the electric charge charged on the substrate through the chucking pin and the rotating shaft to the outside, phenomenon, such as damage to the substrate due to arcing damage and reattachment of particles due to static electricity, have been prevented.

SUMMARY OF THE INVENTION

The present invention has been made in an effort to provide a support unit which discharges static electricity generated due to a chemical liquid supplied to a substrate during rotation of the substrate and other causes, and a substrate treating apparatus.

The object of the present invention is not limited thereto, and other objects not mentioned will be clearly understood by those of ordinary skill in the art from the following description.

An exemplary embodiment of the present invention provides a substrate treating apparatus, including: a cup having a treatment space therein; a support unit configured to support a substrate within the treatment space, and including a rotatable support plate; and a liquid discharge unit configured to discharge a chemical liquid to the substrate supported by the support unit, in which the support unit includes: a plurality of pin members provided to the support plate to support the substrate placed on the support plate; and a discharge member coupled to the pin member to discharge charges to the air according to a rotation of the support plate, and the discharge member is provided as a conductive member.

In the exemplary embodiment, the discharge member may include: a holder part coupled with the pin member; and a discharge part extending from the holder part so as to have a predetermined length.

In the exemplary embodiment, the discharge part may be provided in a plate shape.

In the exemplary embodiment, the discharge part may have a rounded end.

In the exemplary embodiment, the discharge part may be provided with a shorter length as the discharge part goes down.

In the exemplary embodiment, the discharge part may include a plurality of wing members which are provided to be spaced apart from each other and are provided to have different lengths.

In the exemplary embodiment, the wing member may include: a body portion extending from the holder part; and a tip portion provided to a distal end of the body portion, and the tip portion may be provided with a larger cross-sectional area per unit length than a cross-sectional area of the body portion.

In the exemplary embodiment, the body portion may be provided with a shorter length as the body portion goes down.

In the exemplary embodiment, the tip portion may be provided in a circular shape when viewed from the above.

In the exemplary embodiment, the tip portion may be provided in a tapered shape when viewed from the above.

In the exemplary embodiment, the pin member may be grounded.

In the exemplary embodiment, the pin member may include: a plurality of support pins provided to the support plate to support a bottom surface of the substrate placed on the support plate; and a plurality of chucking pins provided to the support plate to support a lateral surface of the substrate placed on the support plate, and the discharge member may be coupled to at least one of the support pin and the chucking pin.

Another exemplary embodiment of the present invention provides a support unit, including: a support plate which is provided to be rotatable and on which a substrate is placed; a plurality of pin members provided to the support plate to support the substrate placed on the support plate; and a discharge member coupled to the pin member and configured to discharge charges to the air according to a rotation of the support plate, and the discharge member is provided as a conductive member.

In the exemplary embodiment, the discharge member may include: a holder part coupled with the pin member; and a discharge part extending from the holder part so as to have a predetermined length.

In the exemplary embodiment, the discharge part may be provided with a shorter length as the discharge part goes down.

In the exemplary embodiment, the discharge part may have a rounded end.

In the exemplary embodiment, the discharge part may include a plurality of wing members which are provided to be spaced apart from each other and are provided to have different lengths, and the wing member may include: a body portion extending from the holder part; and a tip portion provided to a distal end of the body portion, and the tip portion may be provided with a larger cross-sectional area per unit length than a cross-sectional area of the body portion.

In the exemplary embodiment, the body portion may be provided with a shorter length as the body portion goes down.

In the exemplary embodiment, the pin member may be grounded.

In the exemplary embodiment, the pin member may include: a plurality of support pins provided to the support plate to support a bottom surface of the substrate placed on the support plate; and a plurality of chucking pins provided to the support plate to support a lateral surface of the substrate placed on the support plate, and the discharge member may be coupled to at least one of the support pin and the chucking pin.

According to various exemplary embodiments of the present invention, it is possible to discharge static electricity generated due to the chemical liquid supplied to the substrate during rotation of the substrate and other causes.

The effect of the present invention is not limited to the foregoing effects, and the not-mentioned effects will be clearly understood by those skilled in the art from the present specification and the accompanying drawings.

BRIEF DESCRIPTION OF THE DRAWINGS

FIG. 1 is a top plan view schematically illustrating a substrate processing facility according to an exemplary embodiment of the present invention.

FIG. 2 is a cross-sectional view schematically illustrating a substrate treating apparatus according to the exemplary embodiment of the present invention.

FIG. 3 is a top plan view schematically illustrating a substrate support unit provided to the substrate treating apparatus of FIG. 2.

FIG. 4 is a cross-sectional view schematically illustrating the inside of the substrate support unit provided to the substrate treating apparatus of FIG. 2.

FIG. 5 is a perspective view illustrating a discharging member according to the exemplary embodiment of the present invention.

FIG. 6 is a diagram illustrating a state where a chemical liquid is supplied to a substrate which is provided to the substrate treating apparatus and is supported by the support unit according to the exemplary embodiment of the present invention.

FIGS. 7 to 9 are perspective views illustrating discharging members according to other exemplary embodiments of the present invention.

DETAILED DESCRIPTION

Other advantages and features of the present invention, and a method of achieving them, will become apparent with reference to the detailed exemplary embodiment below in conjunction with the accompanying drawings. However, the present invention is not limited to the exemplary embodiments below, and the present invention is only defined by the scope of the claims. Unless defined, all terms (including technical or scientific terms) used herein have the same meaning as commonly accepted by common technology in the prior art to which this invention belongs. A general description of known configurations may be omitted so as not to obscure the gist of the present invention. In the drawings of the present invention, the same reference numerals are used as far as possible for the same or corresponding components.

Terms used in the present application are used only to describe specific exemplary embodiments, and are not intended to limit the present invention. Singular expressions used herein include plurals expressions unless they have definitely opposite meanings in the context. In the present application, it will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

Hereinafter, an exemplary embodiment of the present invention will be described in more detail with reference to the accompanying drawings. The exemplary embodiment of the present invention may be modified in various forms, and the scope of the present invention should not be construed as being limited to the following exemplary embodiments. This exemplary embodiment is provided to more completely explain the present invention to those of ordinary skill in the art. Therefore, the shapes of elements in the drawings are exaggerated and reduced to emphasize a clearer description.

FIG. 1 is a top plan view schematically illustrating a substrate processing facility 1 according to an exemplary embodiment of the present invention.

Referring to FIG. 1, the substrate processing facility 1 includes an index module 10 and a process processing module 20, and the index module 10 includes a load port 120 and a transfer frame 140. The load port 120, the transfer frame 140, and the process processing module 20 may be sequentially arranged in series. Hereinafter, a direction in which the load port 120, the transfer frame 140, and the process processing module 20 are arranged is referred to as a first direction 12, and a direction perpendicular to the first direction when viewed from above is referred to as a second direction 14, and a direction perpendicular to a plane including the first direction 12 and the second direction 14 is referred to as a third direction 16.

A carrier 130 in which a substrate W is accommodated is seated on the load port 140. A plurality of load ports 120 may be provided, and the plurality of load ports 120 may be disposed in series in the second direction 14. The number of load ports 120 may be increased or decreased according to process efficiency, a foot print condition, and the like of the process processing module 20. A plurality of slots (not illustrated) for accommodating the plurality of substrates W in a state arranged horizontally with respect to the ground may be formed in the carrier 130. As the carrier 130, a Front Opening Unified Pod (FOUP) may be used.

The process processing module 20 may include a buffer unit 20, a transfer chamber 240, and a process chamber 260. The transfer chamber 240 may disposed so that a longitudinal direction thereof is parallel to the first direction. The process chambers 260 may be disposed at both sides of the transfer chamber 240. The plurality of process chambers 260 are provided symmetrically to each other based on the transfer chamber 240 at one side and the other side of the transfer chamber 240. The plurality of process chambers 260 are provided at one side of the transfer chamber 240. Some of the process chambers 260 may be disposed in the longitudinal direction of the transfer chamber 240. Further, some of the plurality of process chambers 260 may be disposed to be stacked on each other. That is, the plurality of process chambers 260 may be disposed in an arrangement of A×B at one side of the transfer chamber 240. Herein, A is the number of process chambers 260 provided in series in the first direction 12, and B is the number of process chambers 260 provided in series in the third direction 16. When four or six process chambers 260 are provided at one side of the transfer chamber 240, the process chambers 260 may be disposed in an arrangement of 2×2 or 3×2. The number of process chambers 260 may be increased or decreased. Unlike the foregoing, the process chamber 260 may be provided only to one side of the transfer chamber 240. Further, unlike the foregoing, the process chambers 260 may be provided to one side or both sides of the transfer chamber 240 as a single layer.

The buffer unit 220 may be disposed between the transfer frame 140 and the transfer chamber 240. The buffer unit 220 may provide a space in which the substrate W stays before the substrate W is carried between the transfer chamber 240 and the transfer frame 140. Slots (not illustrated) on which the substrate W is placed may be provided to the inner side of the buffer unit 220, and a plurality of slots (not illustrated) may be provided so as to be spaced apart from each other in the third direction 16. A surface of the buffer unit 220 facing the transfer frame 140 and a surface of the buffer unit 220 facing the transfer chamber 240 may be opened.

The transfer frame 140 may carry the substrate W between the carrier 130 that is seated on the load port 120 and the buffer unit 220. An index rail 142 and an index robot 144 are provided to the transfer frame 140. The index rail 142 may be provided so that a longitudinal direction thereof is parallel to the second direction 14. The index robot 14 is installed on the index rail 142, and linearly moves in the second direction 14 along the index rail 142. The index robot 144 may include a base 144a, a body 144b, and an index arm 144c. The base 144a is installed to be movable along the index rail 142. The body 144b is coupled to the base 144a. The body 144b is provided to be movable in the third direction 16 on the base 144a. Further, the body 144b is provided to be rotatable on the base 144a. The index arm 144c is coupled to the body 144b and is provided to be movable forwardly and backwardly with respect to the body 144b. A plurality of index arms 144c is provided to be individually driven. The index arms 144c are disposed to be stacked in the state of being spaced apart from each other in the third direction 16. A part of the index arms 144c may be used when the substrate W is carried from the process processing module 20 to the carrier 130, and another part of the plurality of index arms 144c may be used when the substrate W is carried from the carrier 130 to the process processing module 20. This may prevent particles generated from the substrate W before the process processing from being attached to the substrate W after the process processing in the process of loading and unloading the substrate W by the index robot 144.

The transfer chamber 2400 transfers the substrate W between the buffer unit 220 and the process chamber 260, and between the process chambers 260. A guide rail 242 and a main robot 244 are provided to the transfer chamber 240. The guide rail 242 is disposed so that a longitudinal direction thereof is parallel to the first direction 12. The main robot 244 is installed on the guide rail 242, and linearly moves in the first direction 12 on the guide rail 242. The main robot 244 includes a base 244a, a body 244b, and a main arm 244c. The base 244a is installed to be movable along the guide rail 242. The body 244b is coupled to the base 244a. The body 244b is provided to be movable in the third direction 16 on the base 244a. The body 244b is provided to be rotatable on the base 244a. The main arm 244c is coupled to the body 244b, and provided to be movable forwardly and backwardly with respect to the body 244b. A plurality of main arms 244c is provided to be individually driven. The main arms 244 are disposed to be stacked in the state of being spaced apart from each other in the third direction 16.

A substrate treating apparatus 3000 performing a cleaning process on the substrate W is provided to the process chamber 260. The substrate treating apparatus 3000 may have a different structure according to the type of performed cleaning process. Contrary to this, the substrate treating apparatus 3000 within each process chamber 260 may have the same structure. Optionally, the process chambers 260 are divided into a plurality of groups, and the substrate treating apparatuses 3000 provided in the process chambers 260 belonging to the same group may have the same structure, and the substrate treating apparatuses 3000 provided in the process chambers 260 belonging to different groups may have different structures. For example, when the process chambers 260 are divided into two groups, the process chambers 260 of a first group may be provided at one side of the transfer chamber 240, and the process chambers 260 of a second group may be provided at the other side of the transfer chamber 240. Optionally, at both sides of the transfer chamber 240, the process chambers 260 of a first group may be provided in a lower layer, and the process chambers 260 of a second group may be provided in an upper layer. The process chambers 260 of the first group and the process chambers 260 of the second group may be divided according to the type of chemicals used and the type of methods used. Contrary to this, the process chambers 260 of the first group and the process chambers 260 of the second group may be provided so as to sequentially perform the process on one substrate W. For example, a chemical treatment process or a rinse process may be performed on the substrate W in the process chambers 260 of the first group, and a rinse process or a dry process may be performed on the substrate W in the process chambers 260 of the second group.

Hereinafter, an exemplary embodiment of the substrate treating apparatus 3000 cleaning the substrate W by using a chemical liquid will be described. The substrate treating apparatus 3000 liquid-treats the substrate. The supplied chemical liquid may be provided as an aqueous phosphoric acid solution, a sulfuric acid aqueous solution, hydrofluoric acid, pure water (DIW), water containing $CO_2$, or IPA.

FIG. 2 is a cross-sectional view schematically illustrating the substrate treating apparatus 3000.

The substrate treating apparatus 3000 is provided to the process chamber 260.

The substrate treating apparatus 3000 includes a cup 320, a support unit 340, a lift unit 360, and a discharge unit 380.

The cup 320 has a treatment space in which a substrate treatment process is performed, and an upper portion of the cup 320 is opened. The cup 320 includes an internal collection container 322, an intermediate collection container 324, and an external collection container 326. The collection containers 322, 324, and 326 collect different chemical liquids among the chemical liquids used in the process. The internal collection container 322 is provided in an annular ring shape surrounding the support unit 340, the intermediate collection container 324 is provided in an annular ring shape surrounding the internal collection container 322, and the external collection container 326 is provided in an annular ring shape surrounding the intermediate collection container 322.

An inner space 322a of the internal collection container 322, an interspace 324a between the internal collection container 322 and the intermediate collection container 324, and an interspace 326a between the intermediate collection container 324 and the external collection container 326 function as inlets through which the chemical liquid are introduced to the internal collection container 322, the intermediate collection container 324, and the external collection container 326, respectively. Collection lines 322b, 324b, and 326b extending vertically downward are connected to the collection containers 322, 324, and 326, respectively. The collection lines 322b, 324b, and 326b discharge the chemical liquids which are introduced through the collection containers 322, 324, and 326, respectively. The discharged chemical liquid may be re-used through an external chemical liquid regeneration system (not illustrated).

The lift unit 360 linearly moves the cup 320 in the vertical direction. As the cup 320 vertically moves, a relative height of the cup 320 with respect to the support unit 340 is changed. The lift unit 360 includes a bracket 362, a movement shaft 364, and a driving unit 366. The bracket 362 is fixedly installed to an external wall of the cup 320, and the movement shaft 364 which is moved in the vertical direction by the driving unit 366 is fixedly coupled to the bracket 362. When the substrate W is placed on the support unit 340 or lifted from the support unit 340, the cup 320 is lowered so that the support unit 340 protrudes above the cup 320. Further, when the process progresses, the height of the cup 320 is adjusted so that the chemical liquid is introduced into the predetermined collection container 360 according to the type of chemical liquid supplied to the substrate W. Optionally, the lift unit 360 may move the support unit 340 in the vertical direction.

The liquid discharge unit 380 supplies the chemical liquid to the substrate W during the substrate treatment process. The liquid discharge unit 380 includes a support shaft 386, a driving unit 388, a nozzle support 382, and a nozzle 384. A longitudinal direction of the support shaft 386 is provided in the third direction 16, and the driving unit 388 is coupled to the lower end of the support shaft 386. The driving unit 388 rotates and lifts the support shaft 386. The nozzle support 382 is vertically coupled to the opposite end of the distal end of the support shaft 386 coupled with the driving unit 388. The nozzle 384 is installed on the bottom surface of the distal end of the nozzle support 382. The nozzle 384 is moved to a process position and a standby position by the driving unit 388. The process position is a position where the nozzle 384 is disposed vertically above the cup 320, and the standby position is a position where the nozzle 384 deviates from the vertical top of the cup 320.

The liquid discharge unit 380 of the substrate treating apparatus 3000 may receive a liquid from a liquid storage tank 400. The liquid storage tank 400 is connected to a first supply line 410 connected to the liquid discharge unit 380 of the substrate treating apparatus 3000. An opening/closing valve may be provided to the first supply line 410.

FIG. 3 is a top plan view schematically illustrating the support unit 340 of the substrate treating apparatus 3000 of FIG. 2, and FIG. 4 is a cross-sectional view schematically illustrating the inside of the substrate support unit 340 of the substrate treating apparatus 3000 of FIG. 2. The support unit 340 of the substrate treating apparatus 3000 will be described with reference to FIGS. 3 and 4.

Referring to FIGS. 3 and 4, the support unit 340 supports the substrate W and rotates the substrate W during the process progress. The support unit 340 includes a support plate 342, a pin member 343, a chucking pin moving unit 347, a rotation shaft 348, a lower nozzle 354, and a discharge member 3100.

The support plate 342 may include a top surface that is generally provided in a circular shape when viewed from above. The pin member 343 includes the support pin 344 and the chucking pin 346. The support plate 344 protrudes upward from an upper surface of the support plate 342 in an edge region of the support plate 342. The support pin 344 supports a bottom surface of the substrate W while being spaced apart a certain distance along the circumference of the support plate 342. In one example, the support pin 344 supports an edge of the bottom surface of the substrate W. In one example, all of the support pins 344 have the same shape and size. The support pin 344 has an upper portion 344a of which a diameter gradually increases as the support pin goes down, and a lower portion 344b that extends downward from the upper portion 344a and has the same diameter. A cylindrical protrusion 344c extending in the longitudinal direction of the support pin 344 is provided on a bottom surface of the lower portion 344b of the support pin 344. A diameter of the protrusion 344c is provided to be smaller than a diameter of the lower portion 344b of the support pin 344. An external surface of the support pin 344 is coated with a conductive material. For example, the conductive material may be conductive ceramics.

The chucking pin 346 protrudes upward from the upper surface of the support plate 342 in the edge region of the support plate 342. The chucking pins 346 are located while being spaced apart from each other by a predetermined distance along the circumference of the support plate 342. In one example, the chucking pin 346 is disposed farther than the support pin 344 from the center of the support plate 342. The chucking pin 346 supports the lateral portion of the substrate W so that the substrate W is not laterally separated from the original position when the substrate W is rotated. In one example, all of the chucking pins 346 may have the same shape and size. In one example, the chucking pin 346 may be a material having corrosion resistance, fire resistance, heat resistance, such as SIC ceramic, CARBON PFA, and CARBON PEEK. The chucking pin 346 includes a support portion 346a, a center portion 346c, a fastening portion 346e, and a locking portion 346d. The support portion 346a has a shape in which the diameter gradually decreases from the flat upper surface to the bottom and then gradually increases again as the support part goes down. Therefore, the support portion 346a has a concave portion 346b concave inward when viewed from the front. The lateral portion of the substrate W placed on the support pin 344 is in contact with the concave portion 346b. The center portion 346c extends downward with the same diameter as the diameter of the lower end of the support portion 346a from the lower end of the support portion 346a. The fastening portion 346e extends downward from the center portion 346c. A screw hole for fastening with the chucking pin moving unit 347, which is to be described below, is formed in the fastening portion 346e. The locking portion 346d extends outward from the center portion 346c, and is provided in a ring shape. In one example, the locking part 346d is in close contact with the upper surface of the support plate 342, and all of the chucking pins 346 protrude with the same height.

In one example, the support pin 344 and the chucking pin 346 may be grounded.

A first ground line 345 is connected to the chucking pin 346. The chucking pin 346 discharges charges charged on the substrate W or a chemical liquid L to the outside through the first ground line 345. The first ground line 345 is made of a conductive material. The first ground line 345 may be provided inside a moving rod 347*a*. The first ground line 345 may be connected to the ground pin 349*a*. In one example, the ground pin 349*a* is electrically connected with a motor 349. The ground pin 349*a* is connected with the motor 349 to discharge the charges generated in the substrate W to the outside. Therefore, the charges charged on the substrate W are discharged to the outside through the chucking pin 346, the first ground line 345, the ground pin 349*a*, and a ground line 600.

Further, a support pin ground member 350 is connected to the support in 344. The support pin ground member 350 includes a second ground line 351, a spring 350*a*, and a rod 350*b*. The support pin 344 discharges the charges charged on the substrate W to the outside through the second ground line 351. The spring 350*a* and the rod 350*b* are made of a metal material. In one example, the rod 350*b* is provided in a radius direction of the support plate 342. One end of the spring 350*a* is connected with the support pin 344, and the other end of the spring 350*a* is connected with the rod 350*b*. The rod 350*b* may be connected to the ground pin 349*a* through the ground line 351. Therefore, the charges charged on the substrate W are discharged to the outside through the support pin 344, the spring 350*a*, the rod 350*b*, the ground pin 349*a*, and the ground line 600. Contrary to the foregoing, the spring 350*a* may have a hollow cylindrical shape surrounding the support pin 344. Therefore, the spring 350*a* maximizes the surface that is in contact with the support pin 344 to more efficiently discharge the charges charged on the substrate W. Further, the rod 350*b* is directly connected with the support pin 344 without the spring 350*a* to discharge the charges charged on the substrate W to the outside.

Contrary to the foregoing exemplary embodiment, the chucking pin 346 may be grounded and the support pin 344 may not be grounded. In another exemplary embodiment, the support pin 344 may be grounded and the chucking pin 346 may not be grounded.

The chucking pin moving unit 347 moves the chucking pin 346 to the support position and the standby position. The support position is the position in which the chucking pins 346 are in contact with the lateral portion of the substrate W during the process progress, and the standby position is the position that provides a wider space than the substrate W is provided so that the substrate W is placed on the support unit 340. Accordingly, the support position is the position closer to the center of the support plate 342 compared to the standby position. The chucking pin moving unit 347 includes the movement rod 347*a* coupled with one chucking pin 346, and the movement rod 347*a* is disposed within the support plate 342 in the same direction as the radius direction of the support plate 342. The chucking pin 346 and the movement rod 347*a* may be screwed together.

The rotation shaft 348 is fixedly coupled to the bottom surface of the support plate 342 to support the support plate 342 and rotates the support plate 342. The rotation shaft 348 is provided in a hollow cylindrical shape. The rotation shaft 348 protrudes to the outside of the cup 320 through an opening formed in the bottom surface of the cup 320. A lower end of the rotation shaft 348 protruding to the outside is fixedly coupled with the motor 349. The motor 349 provides rotational force to the rotation shaft 348, and the rotation shaft 348 is capable of rotating by the rotational force.

The lower nozzle 354 supplies a chemical liquid or treatment gas to a lower surface of the substrate W placed on the support unit 340. The substrate W is placed on the support unit 340 so as to be spaced apart from the upper surface of the support unit 340 by a predetermined distance, and the lower nozzle 354 supplies a chemical liquid or treatment gas to a space between the support unit 340 and the substrate W. The lower nozzle 354 includes an injection head 354*a*. The injection head 354*a* has an upwardly convex shape, and protrudes upward from the support unit 340. A plurality of discharge ports 354*a* and 354*c* is formed in the injection head 354*a*. The discharge ports inject any one of the plurality of chemical liquids, the rinse solution, and dry gas, such as isopropyl alcohol vapor or nitrogen gas. A lower end of the injection head 354*a* is inserted into a through-hole formed at the center of the support unit 340. The chemical liquid and/or dry gas supplied from the nozzle 384 and the lower nozzle 354 are spread from the center region of the upper surface or the lower surface to the edge region of the substrate W by the rotation of the support unit 340 and cleans the substrate W. In the meantime, the present exemplary embodiment is not limited only to the cleaning apparatus for cleaning both surfaces of the substrate W, and is identically applied even to a substrate rotating device of a cleaning apparatus capable of cleaning only one surface of the substrate W. In this case, unlike the both-surface cleaning apparatus, the single-surface cleaning apparatus is not provided with the lower nozzle 354, but may be provided with a purge unit (not illustrated) that passes through the inside of the rotation shaft 348 and provides purge gas to the rear surface of the substrate W.

The discharge member 3100 is coupled to the pin member 343 and discharges charges to the air according to the rotation of the support plate 342. In one example, the discharge member 3100 is provided as a conductive member. In one example, the discharge member 3100 may be made of the same material as that of the chucking pin 346. In one example, the discharge member 3100 may be made of CARBON FPA, CARBON PEEK, and the like.

In one example, discharge member 3100 may be coupled to at least one of the support pin and the chucking pin. Hereinafter, the discharge member 3100 will be described as being coupled to the chucking pin 346. Contrary to this, the discharge member 3100 may be coupled to the support pin 344. Further, the discharge member 3100 may be provided to both the chucking pin 346 and the support pin 344.

Hereinafter, the discharge member 3100 of the present invention will be described in detail with reference to FIG. 5.

Referring to FIG. 5, the discharge member 3100 includes a holder part 3140 and a discharge part 3150. The holder part 3140 is coupled with the pin member 343. The discharge part 3150 extends from the holder part 3140 so as to have a predetermined length. In one example, the discharge part 3150 may be provided in a pin shape. In one example, an end of the discharge part 3150 may be rounded. Therefore, the charges discharged to the air according to the rotation of the support plate 342 may be radiated in a circle around the end. Accordingly, there is an advantage in that the trajectory of the charges discharged to the air becomes large, and the amount of charges discharged from the discharge part 3150 per unit time is increased.

In one example, the discharge part 3150 may include a plurality of wing members 3110, 3120, and 3130 which are provided to be spaced apart from each other and have different lengths. In one example, three wing members 3110, 3120, and 3130 may be provided. Optionally, the wing members 3110, 3120, and 3130 may be provided with more or less than three. In one example, the wing members 3110, 3120, and 3130 may be provided with a first member 3110, a second member 3120, and a third member 3130. The first member 3110, the second member 3120, and the third member 3130 are sequentially placed in the vertical direction. The first member 3110, the second member 3120, and the third member 3130 may include body portions 3114, 3124, and 3134 extending from the holder part 3140 and tip portions 3112, 3122, and 3132 provided to distal ends of the body portions 3114, 3124, and 3134, respectively. In one example, the tip portions 3112, 3122, and 3132 may have large cross-sectional areas per unit length than those of the body portions 3114, 3124, and 3134. Accordingly, there is an advantage in that it is possible to increase the amount of charges discharged per unit time through the end by increasing the trajectory of the charges discharged through the end. For example, when viewed from the above, the tip portions 3112, 3122, and 3132 may be provided in a circular shape.

In one example, the lengths of the first member 3110, the second member 3120, and the third member 3130 are differently provided. Accordingly, there is an advantage in that it is possible to increase the amount of charges discharged from the wing members 3110, 3120, and 3130 per time by preventing interference between the charges discharged from the respective wing members 3110, 3120, and 3130. In one example, the body portions 3114, 3124, and 3134 may be provided with a shorter length as the body portions 3114, 3124, and 3134 are placed lower. For example, the length of the body portion 3114 of the first member 3110 may be the longest, and the length of the body portion 3134 of the third member 3130 may be shortest. The support plate 342 is provided under the third member 3130. Therefore, the discharge member 3100 has a relatively small contact area with air as the discharge member 3100 goes down. Therefore, the amount of charges discharged to the air is large by providing the longest length of the first member 3110.

FIG. 6 is a diagram illustrating a state where a chemical liquid is supplied to the substrate W which is provided to the substrate treating apparatus and is supported by the support unit 340 according to the exemplary embodiment of the present invention. As illustrated in FIG. 6, when a chemical liquid Cl is supplied, static electricity is generated on the chemical liquid Cl and the substrate W. When a rotation speed of the support plate 342 is low, charges are smoothly discharged through the first ground line 345 and the second ground line 351. However, when the rotation speed of the support plate 342 is relatively fast, there is a limit to the amount of charge discharged through the first ground line 345 and the second ground line 351. Further, the speed of the charges discharged through the first ground line 345 and the second ground line 351 is not fast, so that the charge may rather rise backwards on the first ground line 345 and the second ground line 351.

Accordingly, the present invention discharges the charges generated in the substrate W and the chemical liquid to the air through the discharge member 3100, as well as the first ground line 345 and the second ground line 351. The charges generated in the chemical liquid and the substrate W move to the chucking pin 346 and the support pin 344. Thereafter, some of the charges are discharged to the ground line 600 through the first ground line 345 and the second ground line 351, and some of the charges are discharged to the air through the discharge member 3100. The charges discharged to the air through the discharge member 3100 are discharged by the rotational force of the support plate 342, so that even though the rotation speed of the support plate 342 is fast, the charges may be discharged to the air. Further, the amount of charges discharged through the discharging member 3100 is larger than the amount of charges discharged through the first ground line 345 and the second ground line 351. Therefore, it is possible to minimize the influence of the electric charges on the motor connected with the first ground line 345 and the second ground line 351, thereby increasing the lifespan of the motor and the components around the motor.

In the foregoing example, the discharge part 3150 of the discharge member 3100 has been described as having the wing members. However, contrary to this, a discharge member 3100*a* may be provided in a plate shape as illustrated in FIG. 7. In one example, the discharge member 3100*b* is provided in a plate shape, and as illustrated in FIG. 8, the discharge member 3100*b* may be provided such that a length of the discharge part 3150 from a holder part 3140 is decreased as the discharge member goes down.

In the foregoing example, the tip portions 3112, 3122, and 3132 have been described as being provided in the circular shape when viewed from the above. However, contrary to this, the tip portions 3112, 3122, and 3132 may be provided in a tapered shape when viewed from the above. For example, tip portions 3112*a*, 3122*a*, and 3132*a* may be provided in a conical shape as illustrated in FIG. 9. Therefore, the charges may be discharged through a side surface of the cone. Optionally, the discharge member has the conical tip portions 3112*a*, 3122*a*, and 3132*a* as illustrated in FIG. 9, and the body portions 3114, 3124, and 3134 may be provided with a shorter length as the body portions go down.

In the foregoing example, the pin member 343 has been described as being grounded. However, contrary to this, the pin member 343 is not grounded, and only the discharge member 3100 may be provided to the pin member 343.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A substrate treating apparatus, comprising:
a cup having a treatment space therein;
a support unit configured to support a substrate within the treatment space, and including a rotatable support plate; and
a liquid discharge unit configured to discharge a chemical liquid to the substrate supported by the support unit,
wherein the support unit includes:
a plurality of pin members provided to the support plate configured to support the substrate placed on the support plate; and
a discharge member coupled to the pin member configured to discharge charges to air according to a rotation of the support plate, and the discharge member is provided as a conductive member, wherein the discharge member is positioned above the support plate and spaced apart from the support plate.

2. The substrate treating apparatus of claim 1, wherein the discharge member includes:
a holder part coupled with the pin member; and
a discharge part extending from the holder part so as to have a predetermined length.

3. The substrate treating apparatus of claim 2, wherein the discharge part is provided in a plate shape.

4. The substrate treating apparatus of claim 2, wherein the discharge part has a rounded end.

5. The substrate treating apparatus of claim 2, wherein the discharge part is provided with a shorter length as the discharge part goes down.

6. The substrate treating apparatus of claim 2, wherein the discharge part includes a plurality of wing members which are provided to be spaced apart from each other and are provided to have different lengths.

7. The substrate treating apparatus of claim 6, wherein the wing member includes:
a body portion extending from the holder part; and
a tip portion provided to a distal end of the body portion, and
the tip portion is provided with a larger cross-sectional area per unit length than a cross-sectional area of the body portion.

8. The substrate treating apparatus of claim 7, wherein the body portion is provided with a shorter length as the body portion goes down.

9. The substrate treating apparatus of claim 7, wherein the tip portion is provided in a circular shape when viewed from above.

10. The substrate treating apparatus of claim 7, wherein the tip portion is provided in a tapered shape when viewed from above.

11. The substrate treating apparatus of claim 1, wherein the pin member is configured to be grounded.

12. The substrate treating apparatus of claim 11, wherein the pin member includes:
a plurality of support pins provided to the support plate configured to support a bottom surface of the substrate placed on the support plate; and
a plurality of chucking pins provided to the support plate configured to support a lateral surface of the substrate placed on the support plate, and
the discharge member is coupled to at least one of the support pin and the chucking pin.

13. A support unit, comprising:
a support plate which is configured to be rotatable and on which a substrate is placed;
a plurality of pin members provided to the support plate configured to support the substrate placed on the support plate; and
a discharge member coupled to the pin member and configured to discharge charges to air according to a rotation of the support plate, and
the discharge member is provided as a conductive member,
wherein the discharge member is positioned above the support plate and spaced apart from the support plate.

14. The support unit of claim 13, wherein the discharge member includes:
a holder part coupled with the pin member; and
a discharge part extending from the holder part so as to have a predetermined length.

15. The support unit of claim 14, wherein the discharge part is provided with a shorter length as the discharge part goes down.

16. The support unit of claim 14, wherein the discharge part has a rounded end.

17. The support unit of claim 14, wherein the discharge part includes a plurality of wing members which are provided to be spaced apart from each other and are provided to have different lengths, and
the wing member includes:
a body portion extending from the holder part; and
a tip portion provided to a distal end of the body portion, and
the tip portion is provided with a larger cross-sectional area per unit length than a cross-sectional area of the body portion.

18. The support unit of claim 17, wherein the body portion is provided with a shorter length as the body portion goes down.

19. The support unit of claim 13, wherein the pin member is configured to be grounded.

20. The support unit of claim 19, wherein the pin member includes:
a plurality of support pins provided to the support plate configured to support a bottom surface of the substrate placed on the support plate; and
a plurality of chucking pins provided to the support plate configured to support a lateral surface of the substrate placed on the support plate, and
the discharge member is coupled to at least one of the support pin and the chucking pin.

* * * * *